United States Patent [19]

Pai

[11] Patent Number: 4,905,371
[45] Date of Patent: Mar. 6, 1990

[54] METHOD FOR CLEANING PROCESS CONTROL

[75] Inventor: Deepak K. Pai, Burnsville, Minn.

[73] Assignee: Control Data Corporation, Minneapolis, Minn.

[21] Appl. No.: 237,586

[22] Filed: Aug. 26, 1988

[51] Int. Cl.[4] .............................................. H05K 3/34
[52] U.S. Cl. ................................ 29/840; 204/192.15; 204/192.17; 204/192.26
[58] Field of Search ..................... 15/77; 228/103, 104, 228/105; 204/192.15, 192.17, 192.26, 192.3; 427/98, 99

[56] References Cited

U.S. PATENT DOCUMENTS

| | | | |
|---|---|---|---|
| Re. 27,287 | 2/1972 | Lepselter | 204/192.17 X |
| 3,436,327 | 4/1969 | Shockley | 204/192.15 X |
| 3,437,888 | 4/1969 | Hall | 204/192.17 X |
| 3,616,406 | 10/1971 | Turner | 204/192.15 X |
| 4,000,054 | 12/1976 | Marcantonio | 204/192.17 |
| 4,025,404 | 5/1977 | Joly et al. | 204/192.17 X |
| 4,113,578 | 9/1978 | Del Monte | 204/192.15 X |
| 4,462,881 | 7/1984 | Yamamoto et al. | 204/192.15 X |
| 4,526,859 | 7/1985 | Christensen et al. | 204/192.26 X |
| 4,652,336 | 3/1987 | Andrascek et al. | 204/192.3 X |
| 4,753,851 | 6/1988 | Roberts et al. | 204/192.17 X |

OTHER PUBLICATIONS

IBM Tech. Discl. Bull., vol. 18, No. 10, Mar. 1976, p. 3231-by Herdzik et al.

Primary Examiner—Carl J. Arbes
Attorney, Agent, or Firm—Joseph A. Genovese; Richard E. Billion; Robert M. Angus

[57] ABSTRACT

An apparatus and method for a cleaning process control is disclosed. The apparatus includes a printed wire circuit board that is made on a Pyrex glass or other transparent substrate. Components are attached to the printed wire circuit board and then the circuit card assembly which is formed is cleaned using a selected cleaning process. The circuit card assembly can then be inspected to determine the effectiveness of a particular cleaning process by flipping over the transparent circuit card, peering through the substrate to inspect for corrosion and solder balls. The circuit card assembly can then be cleaned more extensively and used again to check a different cleaning process.

4 Claims, 3 Drawing Sheets

METHOD FOR CLEANING PROCESS CONTROL

BACKGROUND OF THE INVENTION

The manufacture of circuit card assemblies includes the steps of soldering components to printed wiring boards and cleaning the boards of residue after soldering. Typically, an adhesive is applied to the larger electrical components, such as leaderless ceramic chip carriers, for the two-fold purpose of dampening vibrations and dissipating heat. If the completed circuit card assembly is inadequately cleaned during its manufacture, solder balls may remain near the leads of electrical components or corrosion may develop around the adhesive applied to the larger components. Solder balls can cause shorts between the leads and corrosion can cause long term reliability problems.

Corrosion is generally not a problem in commercial applications for computers since the environment in most commercial applications is relatively constant. Corrosion does become a problem in applications where the environment surrounding the computer will change, such as in military applications. Military applications are much more prone to introduction of moisture into the circuitry of a computer due to environmental changes. For example, a plane could be sitting on an aircraft carrier in 100° F. heat and 99% humidity at one instance. Shortly after take-off the plane may be in an environment where it is −50° F. As a result of this extreme temperature change, moisture can condense within an on-board computer. Once moisture is introduced into the computer or its components, corrosion becomes a real possibility. The fluxes used during the soldering process normally contain organic acids and activators containing halides. If the cleaning process is not exactly perfect, traces of the chlorine, florine or bromine will be left along with the cleaning fluid. When the moisture is introduced into such a system, corrosion may result.

To maximize the reliability of the completed circuit card assembly, engineers experiment with various cleaning processes and adhesive patterns so that solder balls are eliminated, and corrosion is eliminated or minimized. A cleaning process and an arrangement of adhesives are selected. The circuit card assembly is then manufactured using the selected process and adhesive arrangements. Presently, inspection for solder balls and corrosion is accomplished by removing the components from the circuit card assembly. One disadvantage of this method is the expense involved. Removing the components destroys the circuit card assembly and the components. Because of the expense involved with destroying circuit card assemblies, the number of experiments conducted are generally limited. Limiting the number of experiments, results in less chance that an optimum cleaning process and adhesive arrangement is found.

Another disadvantage is that the current method wastes time. In military contracting, one of the reliability standards requires that completed circuit card assemblies be placed in a humidity chamber for a period of ten days. In the humidity chamber, the environment cycles constantly between 90° F. and 90% humdity and −10° F. and 90% humidity. Presently completed circuit card assemblies are left in the humidity chamber for the full ten days, even though corrosion may have set in earlier. With a method of inspection where corrosion could be detected before the ten-day period, information about selected cleaning processes and adhesive arrangements could be obtained sooner so new selections could be made more quickly, thereby shortening the cycle time required to pick an optimal cleaning process and adhesive arrangement.

Consequently, there is a need for a method and apparatus by which the cleaning processes of the circuit card assembly and the positioning of the adhesives on the larger chips can be tested and inspected without destroying or ruining circuit card assemblies and the components on them. There is also a need for a method and apparatus in which corrosion in the circuit card assemblies can be detected prior to a ten-day cycle in the humidity chamber.

SUMMARY OF THE INVENTION

Disclosed is a method and apparatus for inspecting the circuit card assembly for solder balls and corrosion without having to destroy the components or a usable circuit card. The disclosed method and apparatus also allows the circuit card to be inspected for corrosion during a test period without destroying the circuit card assembly under test.

The apparatus used is a printed wire board on glass. The printed wire board is developed by sputtering a seed layer of titanium and then sputtering copper on Pyrex glass. This process produces a printed wire board on the Pyrex glass substrate having a copper layer which adheres to the glass so that components can undergo repeated solderings and desolderings.

The electrical components are attached to the glass printed wire circuit board using the selected process for soldering and the selected adhesive arrangement. After attaching the components onto the printed wire circuit board, the printed wire circuit board is cleaned using a selected process. Once the assembly and cleaning are completed, the final step is to inspect the results. By flipping over the glass printed wire board looking through the glass, remaining solder balls and the amount of corrosion beneath the components can be noted and recorded. The glass printed wire board can be recycled up to about ten times by desoldering the components and removing the adhesive with a solvent. Since the components are not forcibly removed each time for inspection, the components can also be recycled. The result is that various combinations of adhesive arrangements and cleaning processes can be tried and inspected without having to destroy a number of circuit card assemblies and components. As a result, many more arrangements of adhesives and different selected processes for cleaning the printed wire board can be tested so as to ensure the optimal combination of the cleaning process and the adhesive arrangement.

BRIEF DESCRIPTION OF THE DRAWINGS

For better understanding of. the present invention, reference may be had to the accompanying drawings in which.

These drawings are not intended as a definition of the invention but are provided solely for the purpose of illustrating the preferred embodiment of the invention, described below.

DESCRIPTION OF THE PREFERRED EMBODIMENT

Figure 1:
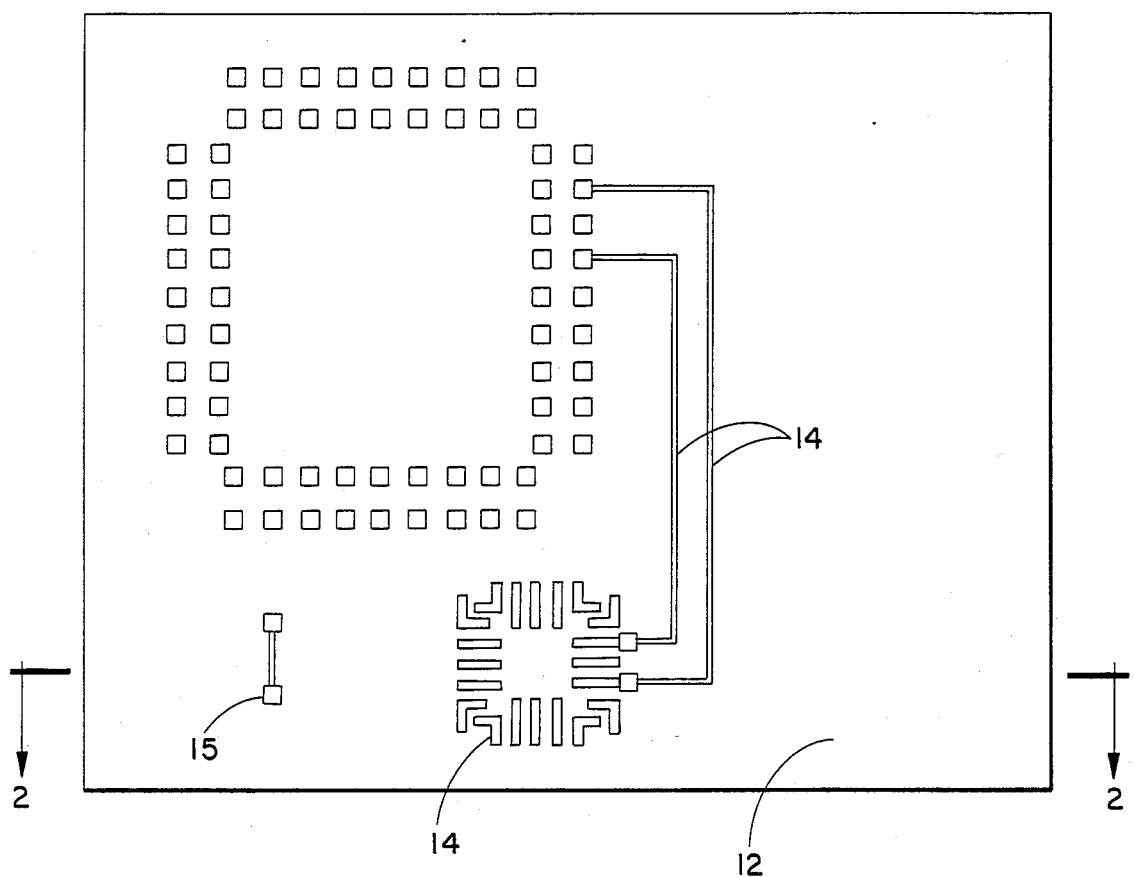
FIG. 1 is a top view of the glass printed wire circuit board without any components.

Shown in FIG. 1 is a glass printed wire circuit board 10. The printed wire board 10 has a substrate 12 made of glass, preferably Pyrex glass or some other treated glass that withstands repeated heating and cooling cycles. The printed wire board also has a copper circuitry 14 attached to the glass substrate 12. The copper circuitry 14 includes pads 15 for attaching selected components.

Figure 2:
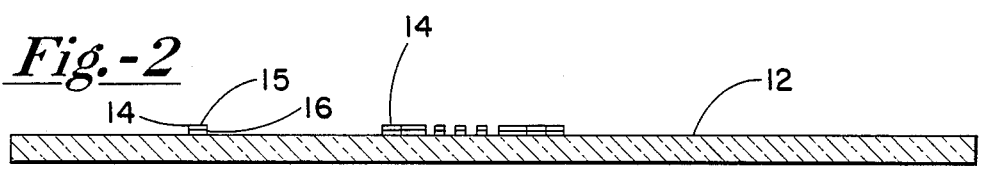
FIG. 2 is a cross-sectional view of the glass printed wire circuit board along line 2—2.

FIG. 2 shows a cross-section of the glass plate along cut line 2—2 in FIG. 1. The substrate made of glass 12 is topped by a layer of titanium 16. The titanium layer 16 is topped by the copper circuitry 14.

Figure 3:
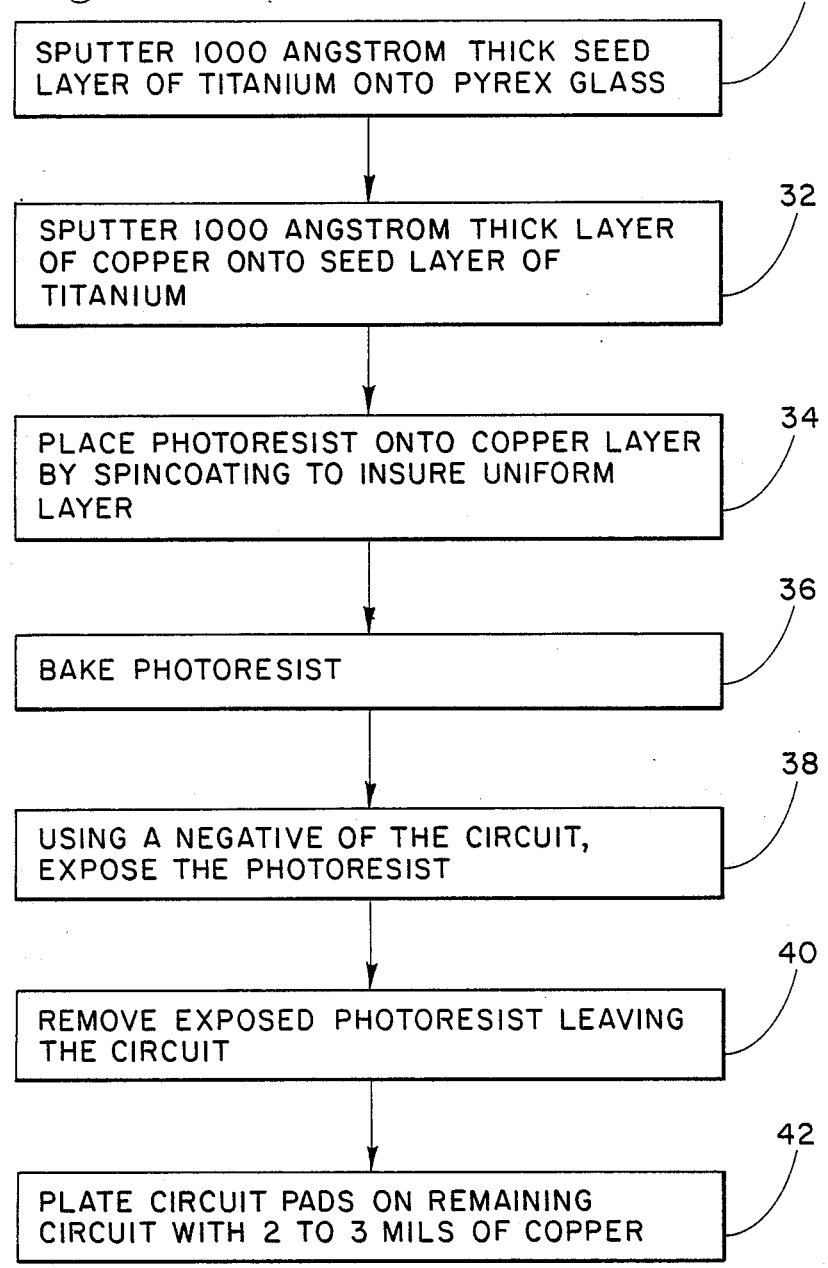
FIG. 3 is a flow diagram which explains the steps involved in creating the glass printed wire board.

Now turning to FIG. 3, the steps for developing the glass printed wire board 10 will be discussed. Basically, the process for attaching or bonding the copper to the glass substrate 12 begins by sputtering a 1,000 angstrom thick seed layer of titanium onto the glass substrate 12 which is depicted as step 30. Next, a layer of copper 1,000 angstrom thick is sputtered onto the layer of titanium, as shown by step 32. It should be noted that a sputtering machine is used to deposit both the titanium seed layer 16 and copper layer 14 onto the substrate 12. The time and the temperature at which sputtering is done basically depends upon the sputtering machine used. As depicted by reference numeral 34 the next step is to spin coat the layer of photoresist onto the sputtered copper. Spin-coating ensures that the photoresist will be a uniform thickness. The next step, as depicted by reference numeral 36, is to bake the photoresist.

After baking the photoresist, a negative of the circuit is used to expose the photoresist in step 38. Next, as depicted by step 40, the exposed photoresist is etched. Etching removes the photoresist, the copper layer, and the titanium layer. The unexposed portions are protected by the photoresist. The final step, depicted by reference numeral 42, is to plate the circuit pads 15 which remain on the circuit with 2-3 mils of copper. The circuit pads 15 are plated rather than sputtered since the copper can be added to the pads 15 more quickly.

It should also be understood that the above-described process for sputtering copper onto a Pyrex glass substrate is useful in thin line technology. This process can be used to produce lines 1 mil in thickness and having a 2 mil pitch. In other words, each copper line can be 1 mil thick with a 1 mil space between each line.

Once the glass printed wire board 10 is made for a particular printed wire board, it is typically used to test an assortment of combinations of adhesive arrangements and cleaning processes.

Figure 4:
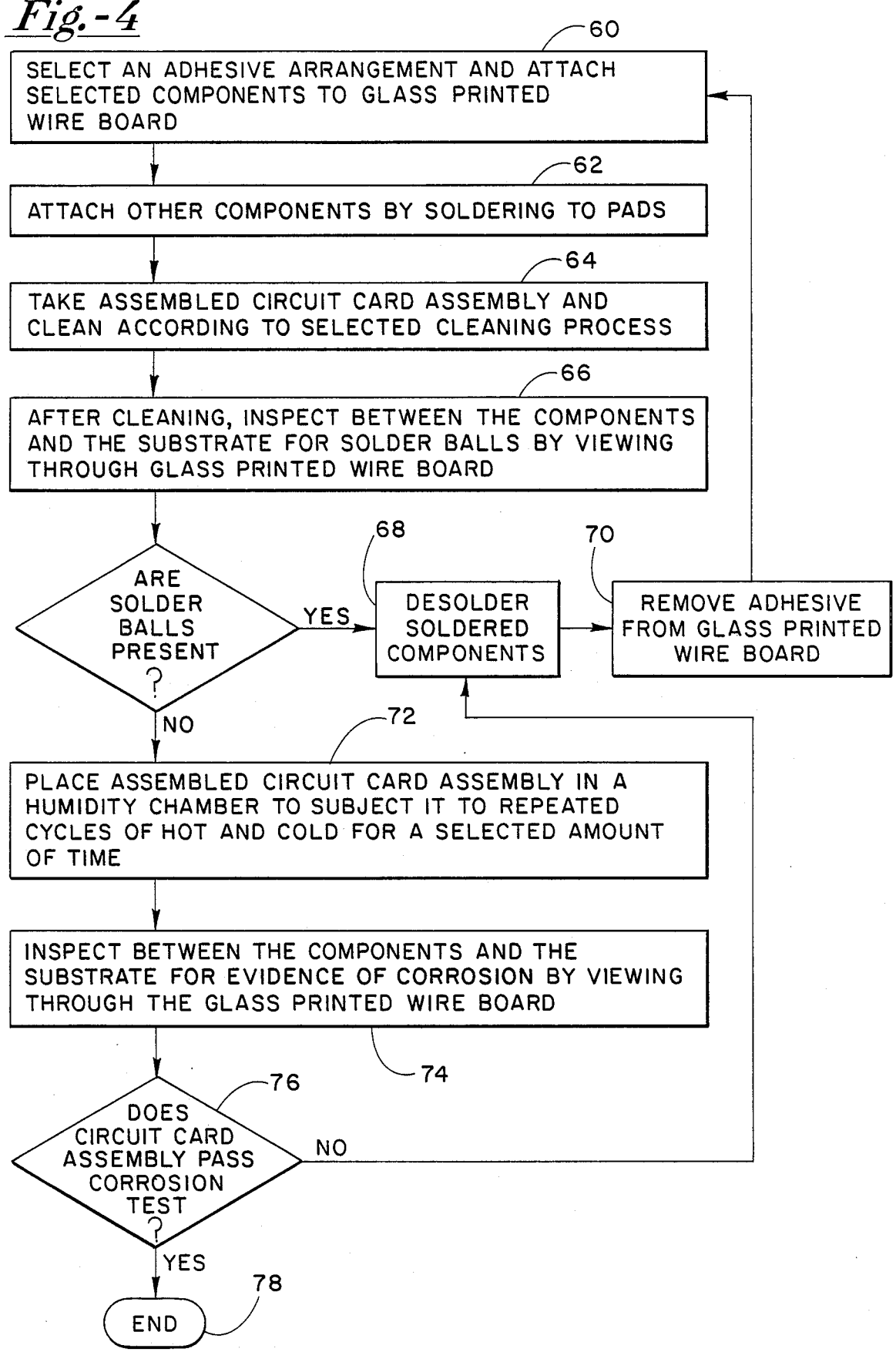
FIG. 4 is a flow diagram which describes the method of inspecting the circuits with the new glass printed wire board.

FIG. 4 shows the steps for testing and inspecting the selected cleaning process and the selected adhesive arrangement on the printed wire boards. As indicated by reference numeral 60, the first step is to select an adhesive arrangement and to attach the selected components, generally the larger electrical components, to the glass printed wire board using the selected adhesive arrangement. In addition to holding the larger components in place, the adhesive also dampens vibrations between the large components and the printed wire board 10. However, the voids produced by the selected adhesive arrangement may result in corrosion if the cleaning process used to clean the assembled circuit card assembly is inadequate. Generally what happens is that moisture is introduced into the printed wire circuit board by changing environmental conditions. The moisture reacts with some chemicals left within the uncleaned flux. The chemicals that tend to cause the corrosion are chlorine, bromine and fluorine, all of which are found in various fluxes.

The remaining components are then soldered to the pads 15 of the glass printed wire board as indicated by step 62 in FIG. 4. Completion of this step results in an assembled circuit card assembly on the glass printed wire board 12. The next step is to take the glass circuit card assembly and clean it according to a selected process indicated by step 64 in FIG. 4. The selected cleaning process generally involves washing the circuit card assembly with non-polar or polar solvents or both types of solvents.

After cleaning, the next step, indicated by reference numeral 66, is to visually inspect for solder balls by viewing between the components and the glass printed wire board 12. Visual inspection is accomplished by flipping over the glass printed wire circuit board assembly 10 and viewing through the glass to see if there are any solder balls captured between the components and the glass substrate 12. If there are solder balls the cleaning process is inadequate. Since the particular cleaning process failed, the glass printed wire board 12 is disassembled so it can be re-used by desoldering the components, as indicated by step 68, and the adhesive is removed from the printed wire board 10 as indicated by step 70. If there are no solder balls, the assembled circuit card assembly is placed in a humidity chamber and subjected to repeated cycles of hot and cold for a specified amount of time as indicated by step 72. The humidity chamber cycles between 90° and 90% humidity down to −10° F. and 90% humidity. The amount of time and the cycling generally corresponds to military standards used to test the reliability of the circuit card assembly.

After the selected amount of time in the humidity chamber, the assembled circuit card assembly is again inspected. As indicted by reference numeral 74, the assembled circuit card assembly is inspected for corrosion by viewing through the glass printed wire board. The humidity chamber tends to introduce moisture into the glass printed wire board due to condensation when the cycle goes from extremely hot to extremely cold. Moisture in combination with elements in residual flux may result in corrosion. Corrosion can easily be seen by viewing through the bottom of the glass wire board 12. Voids caused by the selected adhesive pattern are prone to corrosion.

Next, a decision must be made, as indicated by reference numeral 76, as to whether the circuit card assembly passes the corrosion inspection test. If the circuit card assembly does pass the corrosion test, process ends, as indicated by reference numeral 78. The end indicates that the selected adhesive arrangement is appropriate and that the cleaning process is adequate, such that no corrosion, or the least amount of corrosion is caused by the particular combination of adhesive arrangement and cleaning process. If the circuit card assembly does not pass the corrosion test 76, the glass printed wire board 12 and the components are recycled for use in further tests. The components are desoldered, as indicated by box 68, and the adhesive is removed from the glass printed wire board as indicated by step 70. As also indicated by FIG. 4, the process starts over again by selecting an adhesive arrangement and attaching the selected components to the glass printed wire board, 60. Of course, a new combination of cleaning process and adhesive arrangement will be used in the next test since the prior combination proved to be inadequate.

The glass printed wire circuit board can be used numerous times to test various combinations of cleaning processes and adhesive arrangements. The glass printed wire circuit board is believed to be able to be reused approximately 10 times. Each time the adhesive is removed using a solvent such as methanol with freon or trichloralmethane and the components are desoldered and removed. The components can also be reused.

Advantageously, the inspections can take place at various points within the cycle to determine if failure or inadequate results have occurred. This shortens the time necessary to choose a combination of adhesive pattern and cleaning process since an assembled circuit card assembly which has failed can be detected prior to the time necessary to fully test the circuit card assembly, such as when a nontransparent printed wire board is used.

The present invention and the best mode for practicing it has been described. It is to be understood that the foregoing descriptions are illustrative only and that other means and techniques can be employed without departing from the full scope of the invention as described in the appended claims.

What is claimed is:

1. A method of testing the manufacture of a circuit card assembly from printed wire boards and components, said circuit card assembly tested for the presence of solder balls and corrosion resulting from the combination of a selected arrangement of adhesive used to attach selected components to a printed wire board and a selected cleaning process used to remove residue from soldering the components to the printed wire board, said method comprising the steps of:
    producing a printed wire board on a transparent substrate;
    attaching the selected components to the printed wire board using the selected adhesive arrangement and soldering the leads of the components to the printed wire board;
    cleaning the circuit card assembly, using the selected cleaning process;
    placing the circuit card assembly in an environment which introduces moisture to the circuit card, the circuit card placed in the environment for a selected amount of time; and
    inspecting the circuit card assembly for solder balls and corrosion between the substrate and the components by viewing through the transparent substrate.

2. The method of testing a circuit card assembly of claim 1 wherein the transparent substrate in the producing of a transparent printed wire board step is made of glass.

3. A method for producing a printed wire board on a substrate made of glass comprising the steps of:
    sputtering a seed layer onto the glass substrate;
    sputtering a layer of copper onto the seed layer;
    placing photoresist onto the copper layer;
    exposing the photo resist to a negative of a circuit;
    removing exposed photoresist, the copper layer underneath the exposed photoresist, and the seed layer underneath the exposed photoresist to form a circuit having lines of conductivity and pads; and
    plating the pads with an additional thickness of copper.

4. A method for the manufacture, cleaning and inspecting of circuit card assemblies which includes circuits on substrates and components, said method comprising the steps of:
    sputtering a seed layer of titanium on a glass substrate;
    sputtering a layer of copper on the layer of titanium;
    spin coating the layer of copper with photoresist;
    exposing the photoresist to a negative of a selected circuit;
    removing exposed photoresist and the copper and the titanium beneath the exposed photoresist to leave the circuit on the glass substrate;
    plating areas of the circuit on the glass substrate;
    attaching selected components to the circuit on the glass substrate using a selected adhesive arrangement;
    soldering the components making up a circuit card assembly to the circuit on the glass substrate;
    cleaning the circuit card assembly using a selected cleaning process;
    inspecting the circuit card assembly for solder balls by viewing the area between the glass substrate and the components through the glass;
    placing the circuit card assembly in an environment where moisture is introduced to the circuit card assembly for a selected period of time; and
    inspecting the circuit card assembly for corrosion by viewing the area between the glass substrate and the components through the glass.

* * * * *